United States Patent
Dayalan

(10) Patent No.: US 10,216,869 B2
(45) Date of Patent: Feb. 26, 2019

(54) SYSTEM AND METHOD FOR SIMULATING MULTIPLE BACNET DEVICES AND OBJECTS

(71) Applicant: TRANE INTERNATIONAL INC., Piscataway, NJ (US)

(72) Inventor: Udhaya Kumar Dayalan, Chennai (IN)

(73) Assignee: TRANE INTERNATIONAL INC., Davidson, NC (US)

( * ) Notice: Subject to any disclaimer, the term of this patent is extended or adjusted under 35 U.S.C. 154(b) by 563 days.

(21) Appl. No.: 14/274,203

(22) Filed: May 9, 2014

(65) Prior Publication Data

US 2014/0337001 A1 Nov. 13, 2014

Related U.S. Application Data

(60) Provisional application No. 61/821,839, filed on May 10, 2013.

(51) Int. Cl.
 *G06F 17/50* (2006.01)

(52) U.S. Cl.
 CPC ................. *G06F 17/5009* (2013.01)

(58) Field of Classification Search
 CPC .................................. G06F 17/5009
 USPC ......................................... 703/6–7
 See application file for complete search history.

(56) References Cited

U.S. PATENT DOCUMENTS

| | | | |
|---|---|---|---|
| 7,349,761 B1 | 3/2008 | Cruse | |
| 7,606,683 B2 | 10/2009 | Bahel et al. | |
| 2006/0019679 A1* | 1/2006 | Rappaport | G01S 5/0252 455/456.5 |
| 2008/0262816 A1* | 10/2008 | Lontka | G05B 15/02 703/13 |
| 2010/0114383 A1* | 5/2010 | Rosca | H04L 67/12 700/276 |
| 2012/0253527 A1* | 10/2012 | Hietala | G05B 17/02 700/278 |

(Continued)

OTHER PUBLICATIONS

"Windows Server Simulation Software for BACnet Systems" available at http://www.polarsoft.biz/bacsim.htm at least as early as May 1, 2012, 2 pgs.

(Continued)

*Primary Examiner* — Eunhee Kim
(74) *Attorney, Agent, or Firm* — Hamre, Schumann, Mueller & Larson, P.C.

(57) ABSTRACT

A method for configuring a semi-empirical or an empirical computer simulation model of a building automation and control (BAC) system. The method can include a computer processor reading from a non-transitory computer-readable memory a configuration data of a building automation and control network (BACnet) device, wherein the configuration data includes a property value of the BACnet device. The method includes communicating with a real BACnet device of a real existing BAC system, retrieving real data of the real BACnet device, and storing the real data onto the non-transitory computer-readable memory. The property value of the BACnet device stored on the non-transitory computer-readable memory can be changed to another value that is based on the real data, or the property value of the BACnet device can be added to the configuration data.

9 Claims, 4 Drawing Sheets

(56) References Cited

U.S. PATENT DOCUMENTS

| | | | |
|---|---|---|---|
| 2013/0013121 A1* | 1/2013 | Henze | G06Q 10/04 700/291 |
| 2013/0097480 A1* | 4/2013 | Allison | G06Q 10/10 715/223 |
| 2014/0018940 A1* | 1/2014 | Casilli | G05B 15/02 700/29 |
| 2014/0129197 A1* | 5/2014 | Sons | G06F 17/5004 703/7 |
| 2014/0222394 A1* | 8/2014 | Drees | G06Q 10/0635 703/2 |
| 2014/0222396 A1* | 8/2014 | Wen | G06F 17/5009 703/2 |

OTHER PUBLICATIONS

"BACnet Device Simulator 2.0" available online at http://www.scadaengine.com/software6.html at least as early as May 1, 2012, 2 pgs.

\* cited by examiner

SYSTEM AND METHOD FOR SIMULATING MULTIPLE BACNET DEVICES AND OBJECTS

FIELD

This disclosure generally relates to a method for a computer-based simulation which simulates a building automation and control network (BACnet) and connected systems in the network for performing scalability analysis. The simulator is capable of reading an existing real site building automation and control (BAC) system and configuring a semi-empirical and/or empirical model of Building Automation and Control network (BACnet) devices and/or BACnet Objects (objects of the BACnet protocol standard) for simulating the real site system.

BACKGROUND

A BAC system having a building control network for a heating, ventilation, and air conditioning (HVAC) system can include a BACnet using wired and/or wireless connections, interconnecting multiple BACnet devices (e.g., controllers) for controlling various heating, ventilation, and air conditioning devices. Designing a BAC system can involve using a computer-based simulation of one or more BACnet devices (which is used hereinafter to include BACnet Objects), wherein the simulation involves using estimated values for one or more properties of the BACnet devices. Generally, the BACnet devices' properties that describe the devices are set based on some industry standard information.

SUMMARY

A computer simulation of a BAC system can be accomplished by building computer simulation models of each BACnet device. Such simulation models can use data that is based on estimations and/or industry standards. To execute a computer simulation of the BAC system, each device (and/or BACnet Object) of the BACnet should be modeled (e.g., configured) as configuration data for the simulation. The configuration data includes data for each BACnet device of the BAC system. For example, the configuration data includes one or more properties of the BACnet device and property values for each of the properties. Generally, property values are quantifiable (e.g., numbers) values that can be calculated by the simulation program running on a processor. When the configuration data is configured with data that is based on estimations and/or industry standards, the output is likely not representative of what happens in the real-world. That is, because there is a difference between estimations and the real-world, an estimation model of a particular BACnet device and/or BAC system is not likely to have the same properties as a BACnet device and/or BAC system that exist in the real world. That is, while it can be estimated that one BACnet device connected to another BACnet device may always provide the same output of some property, such may not be the case in the real world because where the BACnet devices exist (and other factors) can affect both individual and the sum of the devices. A simple example of this is that a BACnet device connected to a small BAC system in Texas is likely to have a different performance from the same BACnet device connected to a very large BAC system in Alaska. Purely theoretical simulation models do not compensate for these real world variables. Further, when a particular new device is being developed and/or newly introduced into the market, the simulation model may not have the information or data to be able to simulate that new device or a BAC system which includes that new device. Further, that new device may have very different properties in the real world than what may be expected based on estimations. Further, understanding an existing BAC system is difficult to do with computer simulations that use only estimated values or some industry standard information. Accordingly, understanding design modifications of the existing BAC system is also difficult with computer-based simulations that use only estimated values or some industry standard information. That is, estimations based computer simulations do not accurately reflect an existing BAC system, and thus, they cannot accurately reflect modifications (changes to, addition to, removal therefrom, etc.) to the existing BAC system.

The embodiments disclosed are directed towards systems and methods for configuring a semi-empirical or an empirical computer simulation model of a BAC system, and executing a simulation of the semi-empirical or the empirical computer simulation model of the BAC system.

The terms "real BAC system(s)," "real existing BAC system(s)," "real site(s)," and "real BACnet device(s)" are used herein to mean system, device, etc. that exist in the real world. The term "real data" is used herein to mean observed data from the system, device, etc. that exist in the real world.

An embodiment of a semi-empirical or an empirical computer simulation system includes a processor, a computer-readable memory in communication with the processor, wherein the computer-readable memory has stored thereon a simulation configuration data of a BAC system, and a network interface in communication with the processor. It will be appreciated that one of skilled in the art would understand the computer-readable memory can include, for example, a non-transitory computer-readable memory. The processor is configured to communicate via the network interface with one or more real BACnet device(s) of a real existing BAC system. The processor is configured to receive real data from the one or more real BACnet device(s). The processor can store the real data onto the computer-readable memory, and the processor can modify (e.g., add, change, replace, delete one or more property value(s)) the simulation configuration data (e.g., one or more property value(s) of one or more BACnet device(s)) related to the one or more BACnet device(s) based on the real data. Then, the processor can execute the empirical computer simulation using the modified simulation configuration data.

Another embodiment includes a non-transitory computer-readable memory having stored thereon a simulation configuration data for a semi-empirical or an empirical computer simulation system, wherein the simulation configuration data includes one or more property value(s) of one or more real building automation and control network (BACnet) device(s) of a real existing building automation and control (BAC) system, wherein the one or more property value(s) is(are) based on real data received from the one or more real BACnet device(s).

An embodiment of a method includes loading from a non-transitory computer-readable memory to a processor a simulation configuration data of a BACnet device, wherein the configuration data includes a property value of the BACnet device, communicating with a real BACnet device of a real existing BAC system, retrieving real data from the real BACnet device, storing the real data onto the non-transitory computer-readable memory, and changing the property value of the BACnet device stored on the non-transitory computer-readable memory to another value that is based on the real data.

Another embodiment of a method includes loading from a non-transitory computer-readable memory to a processor a configuration data of a plurality of BACnet devices, wherein the configuration data includes property values of the BACnet devices, communicating with a plurality of real BACnet devices of a real existing BAC system, retrieving real data from the real BACnet devices, storing the real data on the non-transitory computer-readable memory, and changing the property values of the BACnet devices stored on the non-transitory computer-readable memory to other values that are based on the real data.

Another embodiment of a method includes loading from a non-transitory computer-readable memory to a processor a configuration data of a BACnet device, wherein the configuration data includes one or more property values of the BACnet device, communicating with a real BACnet device of a real existing BAC system, retrieving real data from the real BACnet device, storing the real data on the non-transitory computer-readable memory, configuring an updated configuration data by adding to the configuration data a simulation model of the real BACnet device, wherein the simulation model of the real BACnet device includes a property value that is based on the real data, and storing the updated configuration data on the non-transitory computer-readable memory.

Another embodiment of a method includes loading from a non-transitory computer-readable memory to a processor a configuration data of a plurality of BACnet devices, wherein the configuration data includes property values of the BACnet devices, communicating with a plurality of real BACnet devices of a real existing BAC system, retrieving real data from the real BACnet devices, storing the real data on the non-transitory computer-readable memory, configuring an updated configuration data by adding to the configuration data a plurality of simulation models of the real BACnet devices, wherein the simulation models of the real BACnet devices include property values that are based on the real data, and storing the updated configuration data on the non-transitory computer-readable memory.

Another embodiment of a method includes loading from a non-transitory computer-readable memory to a processor a configuration data of a BACnet device, wherein the configuration data does not include one or more property value(s) of one or more of the BACnet device(s). For example, the configuration data may not yet have any property value for the BACnet device. For example, the configuration data may not yet have one or some of the property value(s) of the BACnet device. The method includes communicating with a real BACnet device of a real existing BAC system, retrieving real data from the real BACnet device, storing the real data on the non-transitory computer-readable memory, configuring an updated configuration data by adding a real property value that is based on the real data of the real BACnet device to the configuration data, and storing the updated configuration data on the non-transitory computer-readable memory.

Another embodiment of a method includes communicating with a BACnet device of a BAC system, retrieving data from the BACnet device, storing the data on a non-transitory computer-readable memory, configuring a configuration data for simulating the BACnet device with a processor, wherein the configuration data includes a property value that is based on the data of the BACnet device retrieved in the retrieving step, and storing the configuration data on the non-transitory computer-readable memory.

An embodiment of a method for simulating a semi-empirical or empirical computer model of a BAC system includes configuring the semi-empirical or empirical computer simulation model of the BAC system according to any one or more of the methods described herein, and then executing with a processor a computer simulation of the semi-empirical or empirical computer simulation model of the BAC system.

Another embodiment of a method for simulating a semi-empirical or empirical computer model of a BAC system includes executing with a processor a simulation of a semi-empirical or empirical computer simulation model of the BAC system, wherein the computer simulation model had previously been built according to any one or more of the methods described herein.

Another embodiment is a specialized computer configured to perform any one or more of the methods described herein.

Another embodiment is a simulator system configured to perform any one or more of the methods described herein.

DETAILED DESCRIPTION

Figure 1:
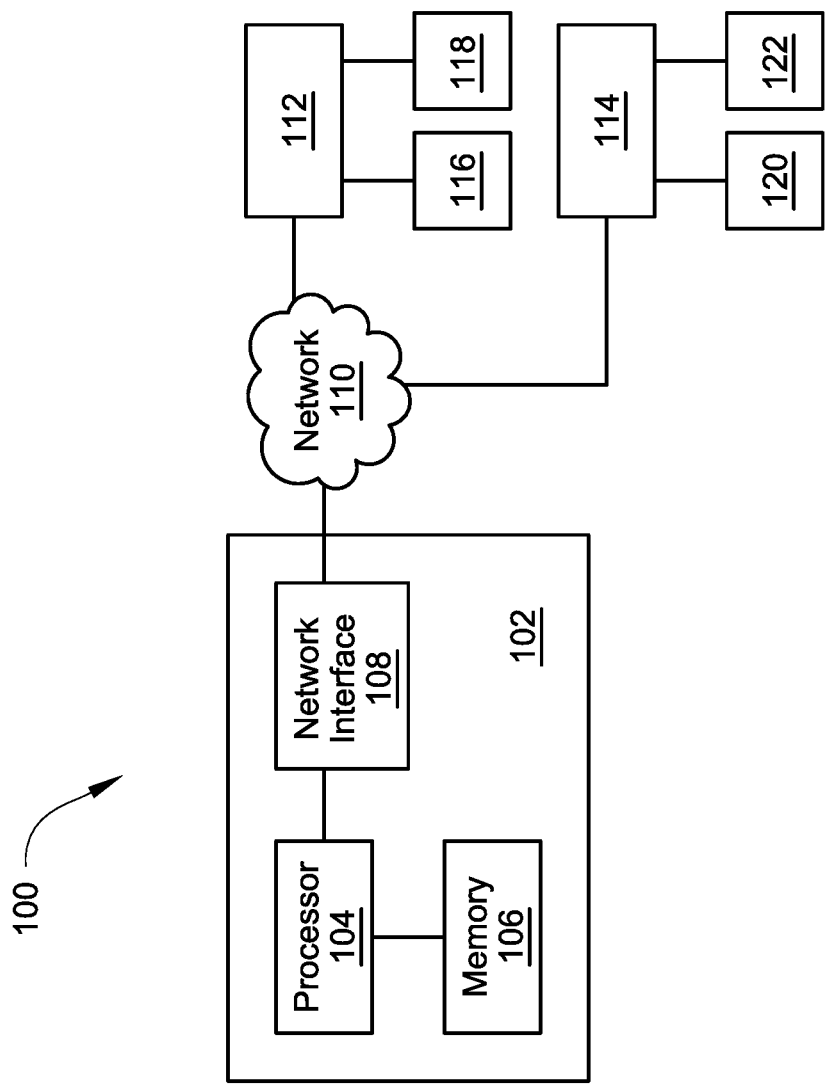
FIG. 1 illustrates a schematic diagram of an exemplary simulation system according to an embodiment.

This disclosure is directed to devices and methods for configuring a semi-empirical or an empirical computer simulation model of a BAC system.

A computer configured to execute a simulation program is connected to a network. One or more real site BAC systems and real BACnet devices are also connected to the network. Accordingly, the computer can connect to the BAC systems and/or BACnet devices and retrieve real data from the BAC systems and/or BACnet devices. That is, the real data are empirical data (e.g., real world information about the BAC systems and/or BACnet devices).

The computer configures a configuration data of the BACnet devices by adding and/or changing property values for executing the simulation program with property values that are based on the retrieved real data. That is, the values for the properties of the BACnet devices in the configuration data can be either the retrieved real data or a transformed value that is based on the retrieved real data. Thus, the simulation can be a semi-empirical model of the BAC system(s) and/or BAC device(s), wherein some of the properties (or information) used in the simulation are based on the retrieved real data (e.g., observed from real world) and other properties are not based on the retrieved real data (e.g., these properties are based on estimated values and/or some industry standards). The simulation can be an empirical model of the BAC system(s) and/or BAC device(s), wherein all of the properties used in the simulation are based on the retrieved real data.

An embodiment of a network includes a BACnet in communication via the Internet. In some embodiments, a portion of a network may be established through, for example, a wire. A portion of the network is established wirelessly via a wireless network. In some embodiments, the wireless network may be established via or include WiFi, cellular, Bluetooth, Infrared, Radio, Microwave, and/or a mesh network.

BACnet is a communication protocol for building automation and control systems of, for example, a HVAC system, lighting control, access control, a fire control system, etc. The BACnet provides a way for BACnet devices to exchange information. For example, in a HVAC system, a BACnet device, such as a system controller (SC) may communicate with a plurality of other BACnet devices, such as unit controllers (UCs) to retrieve information from the UCs. The SC can make control decisions based on the information retrieved from the UCs, and communicate the control decisions to the UCs. The UCs can be configured to control a variety of devices, such as, for example, but not limited to, air handler units, terminal equipment, and/or rooftop units. The UCs may also be configured to be able to communicate with an array of sensors to receive, for example, indoor air temperature, or outdoor air temperature.

A computer-based simulator is a computer device and/or system having a simulation program that can be executed by a computer processor. The simulation program can be stored on a computer-readable memory, such as, for example, a non-transitory computer-readable memory. The embodiments of the simulator described herein are directed towards simulating BAC systems, BACnet devices, HVAC systems, HVAC devices, etc. The simulator provides for design of, modification of, hypothetical studies of, addition and/or deletion of various BACnet devices to/from the BAC systems.

The simulation program requires configuration data, which can be stored on the non-transitory computer-readable memory and read by the processor when executing the simulation program by the simulator. The configuration data includes data for each simulation object that is a computer model of a real device (e.g., BACnet device). Each simulation model is described in the configuration data with properties and property values. The properties can include but are not limited to device type, size, dimensions, flow rate, energy use, horse power, frequency, phase, density, flow, power, voltage, current, weight, connection types, connectivity to other device(s) and/or system(s), capacity, thermodynamic data, temperature, pressure, set points, deltas (i.e., changes) of other properties over time, averages, etc. That is, information needed to simulate the device and/or system in the computer executed computer simulation. In some embodiments, property values are the numerical values associated with the property. Property values are used by the simulation program to simulate an operation of the simulation model of the device(s) and/or system(s). The embodiments as disclosed herein can assist in construction of, modification of, or otherwise simulating one or more BAC systems.

References are made to the accompanying drawings that form a part hereof, and in which is shown by way of illustration of the embodiments in which the methods and systems described herein may be practiced.

FIG. 1 illustrates an exemplary schematic diagram of an embodiment of a simulator system 100. The system 100 includes a computer 102, which includes a processor 104, a computer-readable memory (e.g., a non-transitory computer-readable memory) 106 in communication with the processor 104, and a network interface 108 in communication with the processor 104. The processor 104 executes the simulation program. The computer-readable memory 106 stores thereon the simulation program and the configuration data of simulation models of BAC systems and devices. The network interface 108 connects to a network 110. The network 110 connects to one or more real site existing BAC systems 112, 114. Thus, the processor 104 can connect to one or more of the BAC systems 112, 114 via the network interface 108 and the network 110. Each of the BAC systems 112, 114 has one or more BACnet devices 116, 118, 120, 122. The processor 104 is configured to read from the computer-readable memory 106 the simulation program and the configuration data to execute the simulation program. The processor 104 communicates with the network interface 108 to connect to one or more of the BAC systems (or BACnet site) 112, 114 via the network 110 to retrieve real data of one or more BACnet devices 116, 118, 120, 122. The processor 104 can modify (e.g., add, change, replace, delete one or more property value(s)) the simulation configuration data (e.g., one or more property value(s) of one or more BACnet device(s)) related to the one or more BACnet device(s) based on the real data. The processor 104 can store the real data to the computer-readable memory 106. The processor 104 converts the retrieved real data to one or more property value(s) of one or more BACnet device(s) used in the configuration data. Then the processor 104 can execute the simulation program using the configuration data and the one or more property value(s) based on the real data. It will be appreciated that the combination of using the configuration data which includes at least some of the default configuration data for running the simulation and data (e.g., one or more property value(s)) that is based on the real data can be understood as the configuration data having been updated and/or modified. That is, the model representing a BACnet device, which can be simulated by the processor 104 using the simulation program, is an empirical model of an existing site and/or a semi-empirical model where one or more of the property value(s) are based on a real existing BACnet device located at the existing site.

The exemplary simulator system 100 can be configured to simulate, for example, more than 10,000 BACnet sites (including various BACnet devices) in the network 110. Each BACnet site 112, 114 can be simulated with a plurality of BACnet devices using the simulation system 100. The simulator system 100 can simulate each BACnet device based on retrieved real data from a real existing BACnet system.

The simulator system 100 provides one or more of the following: Performing scalability testing on hundreds or thousands of BACnet sites, gathering real data from the BACnet site(s) (including one or more BAC system(s) and device(s)) at a regular time rate (e.g., every 15 minutes), and responding to various connectivity modules.

The simulator system 100 can also provide for simulating devices that are absent in the real site BACnet system, and simulating devices which otherwise do not have simulation property data in a standard simulation models by retrieving real data of that device and adding property values that are based on the real data to the configuration data, providing for simulation of any object and/or device, simulating the entire real existing site based on retrieved data, and can provide for empirical model construction for computer simulation based on the empirical data.

The real data retrieval can be fully or partially automated. For example, the automated real data retrieval can eliminate a need for a user to collect and convert real data to each of the property values for each of the properties for each BACnet device. Accordingly, the automated real data retrieval can provide efficient model construction by saving hundreds of hours which might otherwise be required otherwise.

Figure 2:
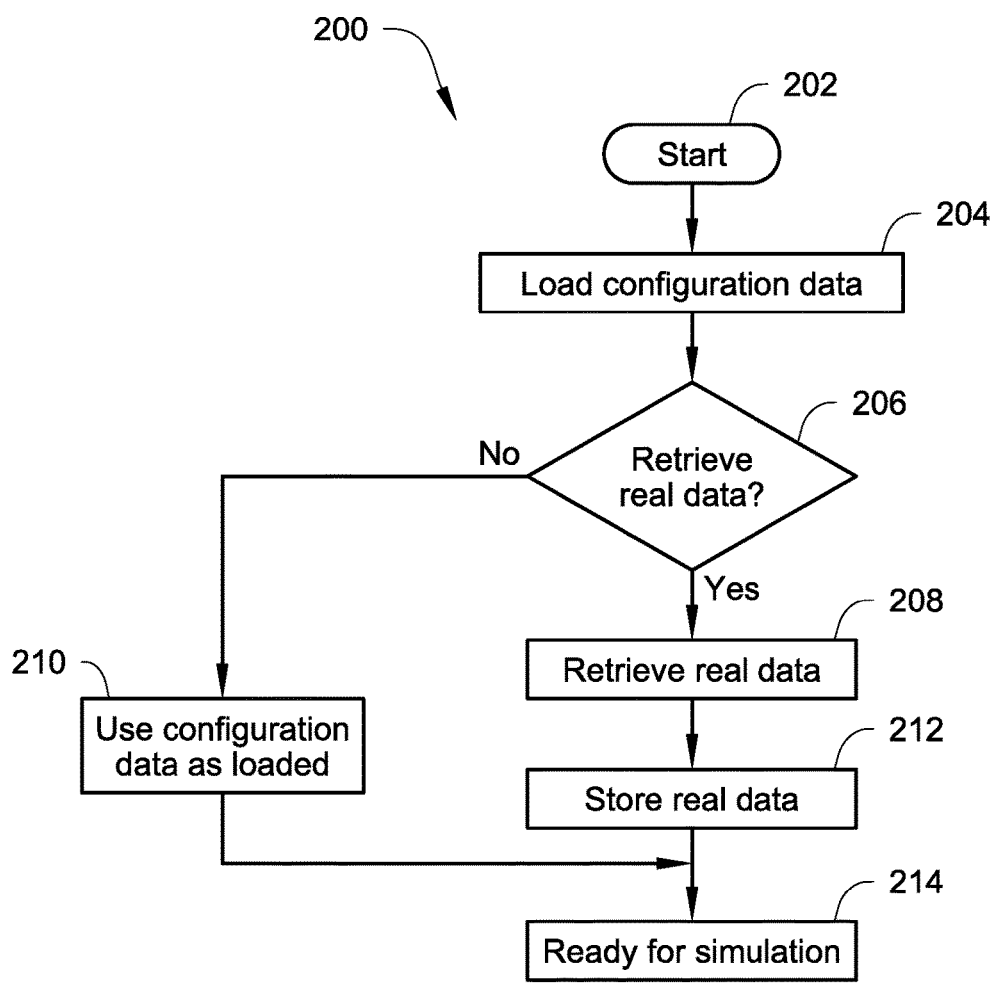
FIG. 2 illustrates a flowchart according to an embodiment of a method.

FIG. 2 illustrates an exemplary flowchart of a process according to an embodiment of a method for configuring (which can include modifying) a configuration data for a computer simulation of a BAC system. The process 200 begins at start up 202 of a simulation program, by which a computer, which includes a processor, a non-transitory computer-readable memory, and a network interface, executes the simulation program. The processor can load the simulation program from the non-transitory computer-readable memory. A user may be required to log in to the computer for using the simulation program. Then, the process 200 includes a step of loading configuration data 204 from the non-transitory computer-readable memory to the processor. The configuration data may be a default set of data stored in the non-transitory computer-readable memory. The default set of data may be pre-existing data, either based on industry standards, estimations, or modified versions thereof, or other data that may include previously stored real data. The user may have the option of selecting and/or changing the configuration data. Then the process 200 provides for the user to use the computer configured to load real data 206 from one or more existing real BAC system(s). That is, the process 200 can provide the user to use the computer to retrieve real data 206 from one or more BACnet device(s) from one or more real BAC system(s). The computer is configured so that the user can select the parameters (e.g., network connection type and information for connecting to the BACnet device and/or the BAC system via a network) for retrieving the real data. For example, the computer is configured so that the user can use the simulation program to connect to the real BAC system or BACnet device using the IP network address, port number, and/or other network information. The computer can then automatically read and retrieves real data 208 from the one or more BAC system(s) and/or one or more BACnet device(s).

The method can include a data conversion step, wherein real data can be converted into other data by a processor for creating a virtual model of the real device for the computer simulation. The conversion of the real data, by the processor, into information for the configuration data of the simulation can be a conversion of the real data into a value for a property of the configuration data. For example, the retrieved real data can be in English Units (e.g., inches, pounds, etc.), and these real data converted into values in metric units for the simulation. For example, the retrieved real data can be combined, used, and/or converted into other types of property value(s) based on, for example but not limited to, relational equations thereof and/or with other values and/or properties. For example, the retrieved data of volume and time can be converted into a flow rate property value. One skilled in the art would understand and appreciate various ways of which the retrieved real data can be converted into values of properties needed for building a computer based model of the device and/or system for executing a computer simulation thereof. In step 212, the retrieved real data can be stored (e.g., wherein the real data may be serialized so that the real data can be translated into a format that can be stored so that the real data can be reconstructed for later use) to the non-transitory computer-readable memory of the computer so that the real data can be used in future simulations. The simulation program is ready 214 for being executed by the processor. The simulation model constructed according to this method is based on real data. That is, the configuration data loaded in step 204 has been modified (e.g., one or more property value(s) of one or more BACnet device model(s) has(have) been changed, added, deleted, replaced, etc. by another one or more property value(s)). Accordingly, the simulation model is either a semi-empirical model or an empirical model. The steps 206 to 212 can be performed for each BACnet device.

It will be appreciated that if a model of the BACnet device requires one or more property value(s) for running the simulation but the real data retrieved cannot be converted into the appropriate property value(s), a default property value from the default data (e.g., from the configuration data loaded in step 204) can be used.

From step 206, there can be an option of not using the real data, but instead using the default data from the configuration data 210. If the default data includes real data that was retrieved and stored previously, the simulation model that is executed using the default data can also be either a semi-empirical model or an empirical model. Further, from step 206, the user can be provided with a computer interface which allows the user to select from a set of previously stored data. Upon the user's selection, the data selected and the configuration data of the user's selection us loaded into the non-transitory computer-readable memory and used in the simulation. If the selected data includes real data that was retrieved and stored previously, the simulation model that is executed using the selected data can also be either a semi-empirical model or an empirical model.

Figure 3:
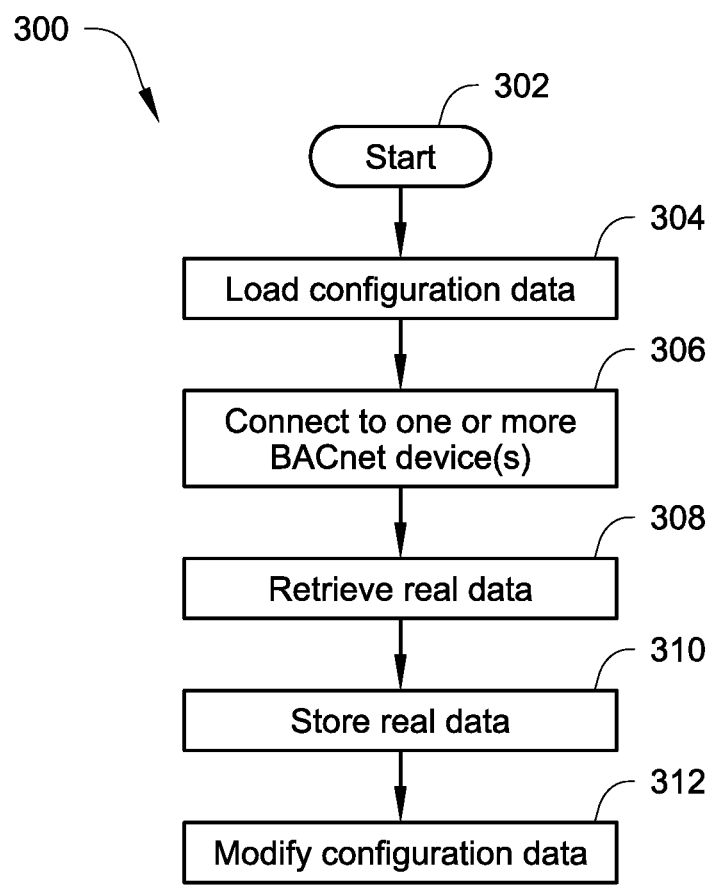
FIG. 3 illustrates a flowchart according to an embodiment of a method.

FIG. 3 illustrates another exemplary flowchart of an embodiment of a process for configuring a configuration data for a computer simulation of a BAC system. The process 300 begins at start up 302 of a simulation program by a processor. The processor can load the simulation program from a non-transitory computer-readable memory. The process 300 includes a step of loading configuration data 304 of one or more building automation and control network (BACnet) device(s) from the non-transitory computer-readable memory to the processor. The process 300 includes the step 306 of the processor communicating with one or more real BACnet device(s) of a real existing BAC system. Then, the process 300 includes the step 308 of retrieving real data from the one or more real BACnet device(s). The process 300 includes the step 310 of storing the real data onto the non-transitory computer-readable memory (which can include serializing the real data so that the real data can be translated into a format that can be stored so that the real data can be reconstructed for later use). Then, the process 300 includes the step 312 of the processor modifying the configuration data based on the real data (e.g., one or more property value(s) of one or more BACnet device model(s) in the configuration data loaded in step 304 is(are) changed, added, deleted, replaced, etc. by another one or more property value(s) that is(are) based on the real data).

The configuration data can include one or more property value(s) of the one or more BACnet device(s), and the modifying step 312 can include changing the one or more property value(s) of the one or more BACnet device(s) stored on the non-transitory computer-readable memory to one or more another value(s) that is(are) based on the real data.

In some embodiment, the configuration data includes one or more property value(s) of the one or more BACnet device(s).

In some embodiments, the configuration data does not include one or more property value(s) of the one or more BACnet device(s).

In some embodiments, the configuration data does not include any property values of the one or more BACnet device(s).

Figure 4:
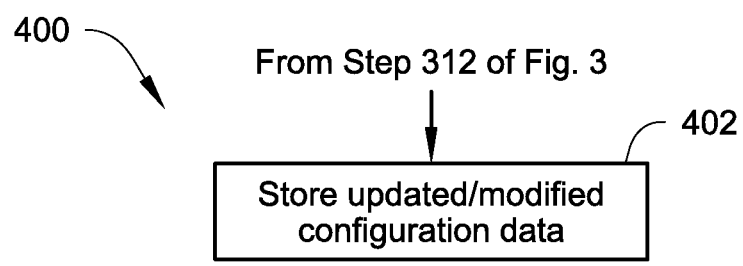
FIG. 4 illustrates a partial flowchart which continues from the flowchart shown in FIG. 3, according to an embodiment of a method.

In an embodiment, the modifying step 312 can include configuring an updated configuration data by adding one or more simulation model(s) of the one or more real BACnet device(s) to the configuration data, wherein the one or more simulation model(s) of the one or more real BACnet device(s) includes one or more property value(s) that is(are) based on the real data. As shown in FIG. 4, the process 400 can include all of the steps in the process (200 of FIG. 2 and/or 300 of FIG. 3) and further include step 402 of storing the updated configuration data on the non-transitory computer-readable memory.

Figure 5:
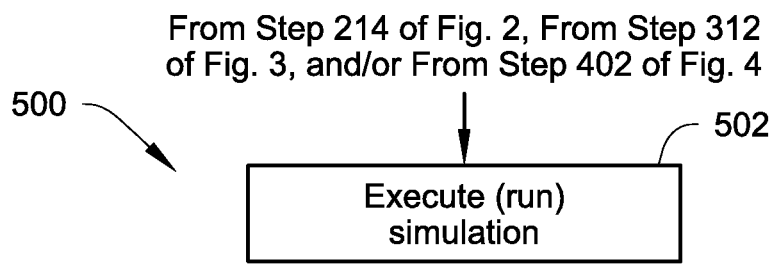
FIG. 5 illustrates a partial flowchart which continues from the flowchart shown in FIG. 2, the flowchart shown in FIG. 3, and/or the flowchart shown in FIG. 4, according to an embodiment of a method.

FIG. 5 shows an embodiment of the process 500, which includes all of the steps in any one or more of the above mentioned processes (200 of FIG. 2, 300 of FIG. 3, and/or 400 of FIG. 4), and further includes the step 502 of executing with a processor a simulation of the semi-empirical or empirical computer simulation model of the BAC system using the modified and/or updated configuration data (e.g., which includes information based on the real data).

With regard to the foregoing description, it is to be understood that changes may be made in detail without departing from the scope of the present invention. It is intended that the specification and depicted embodiment to be considered exemplary only, with a true scope and spirit of the invention being indicated by the broad meaning of the claims.

What is claimed is:

1. A semi-empirical or an empirical computer simulation system for designing a building automation and control (BAC) system, comprising
a processor;
a non-transitory computer-readable memory in communication with the processor, wherein the non-transitory computer-readable memory has stored thereon a simulation configuration data of one or more simulation model(s) of one or more building automation and control network (BACnet) device(s) of the BAC system; and
a network interface in communication with the processor, wherein the processor is configured to communicate via the network interface with one or more real BACnet device(s) of a real existing BAC system,
the processor is configured to receive real data from the one or more real BACnet device(s),
the processor is configured to store the real data onto the non-transitory computer-readable memory, wherein the non-transitory computer-readable memory has stored thereon the real data, and
the processor is configured to modify the one or more simulation model(s) of the one or more BACnet device(s) based on the real data to construct the semi-empirical or the empirical simulation model(s) of the one or more BACnet device(s) by adding a new simulation configuration data, which includes a property value based on the real data, to the one or more simulation model(s) of the one or more BACnet device(s) of the BAC system, and by deleting a default simulation configuration data from the one or more simulation model(s) of the one or more BACnet device(s) of the BAC system based on the real data, and
the processor is configured to execute a simulation of the semi-empirical or the empirical computer simulation model of the BAC system and to output a result of the simulation.

2. The semi-empirical or an empirical computer simulation system as in claim 1, wherein the non-transitory computer-readable memory has stored thereon a modified simulation configuration data of the one or more simulation model(s) of the one or more BACnet device(s), wherein the modified simulation configuration data includes one or more property value(s) of one or more BACnet device(s), wherein the one or more property value(s) is(are) based on the real data such that at least some of the modified simulation configuration data is different from a default configuration data of the one or more BACnet device(s).

3. A method for configuring a semi-empirical or an empirical computer simulation model of a building automation and control (BAC) system and simulating the semi-empirical or the empirical computer simulation model for designing the BAC system, the method comprising:
loading from a non-transitory computer-readable memory to a processor a configuration data of one or more building automation and control network (BACnet) device(s);
communicating with one or more real BACnet device(s) of a real existing BAC system;
retrieving real data from the one or more real BACnet device(s);
storing the real data onto the non-transitory computer-readable memory;
the processor modifying the configuration data based on the real data and constructing the semi-empirical or the empirical simulation model by adding a new simulation configuration data, which includes a property value, to the one or more simulation model(s) of the one or more BACnet device(s) of the BAC system based on the real data, and by deleting a default simulation configuration data from the one or more simulation model(s) of the one or more BACnet device(s) of the BAC system based on the real data; and
the processor executing a simulation of the semi-empirical or the empirical computer simulation model of the BAC system and outputting a result of the simulation.

4. The method according to claim 3,
wherein the configuration data includes one or more property value(s) of the one or more BACnet device(s); and
the modifying step includes changing the one or more property value(s) of the one or more BACnet device(s) stored on the non-transitory computer-readable memory to one or more another value(s) that is(are) based on the real data.

5. The method according to claim 3,
wherein the modifying step includes configuring an updated configuration data by adding one or more simulation model(s) of the one or more real BACnet device(s) to the configuration data, wherein the one or more simulation model(s) of the one or more real BACnet device(s) includes one or more property value(s) that is(are) based on the real data; and
the method further comprises storing the updated configuration data on the non-transitory computer-readable memory.

6. The method as in claim 3, wherein the configuration data includes one or more property value(s) of the one or more BACnet device(s).

7. The method as in claim 3, wherein the configuration data does not include one or more property value(s) of the one or more BACnet device(s).

8. The method as in claim 3, wherein, in the loading step, the configuration data does not include any default property value(s) of the one or more BACnet device(s) that is(are) modified in the modifying step for the constructing of the semi-empirical or the empirical computer simulation model.

9. A non-transitory computer-readable memory having stored thereon a simulation configuration data for a semi-empirical or an empirical computer model simulation system, wherein the simulation configuration data includes semi-empirical or empirical model data of one or more property value(s) from one or more real building automation and control network (BACnet) device(s) of a real existing building automation and control (BAC) system, wherein the semi-empirical or empirical model data is created using real data received from the one or more real BACnet device(s) by a processor adding a new property value to the simulation configuration data of the BACnet device(s) of the BAC system based on the real data, and the processor deleting a default property value from simulation configuration data of the BACnet device(s) of the BAC system based on the real data, wherein the processor can execute a simulation of the semi-empirical or the empirical computer simulation model based on the simulation configuration data for outputting a result of the simulation.

\* \* \* \* \*